(12) United States Patent
Martin Neira et al.

(10) Patent No.: US 7,010,439 B2
(45) Date of Patent: Mar. 7, 2006

(54) DIGITAL CIRCUIT FOR MEASURING THE POWER OF A SIGNAL

(75) Inventors: Manuel Martin Neira, Oegstgeest (NL); Petri Viljo Emil Piironen, Noordwijk (NL); Adriano José Camps Carmona, Barcelona (ES); Luis Sempere Payá, Valencia (ES)

(73) Assignee: Agence Spatiale Europeenne, Paris (FR)

( * ) Notice: Subject to any disclaimer, the term of this patent is extended or adjusted under 35 U.S.C. 154(b) by 219 days.

(21) Appl. No.: 10/391,869

(22) Filed: Mar. 19, 2003

(65) Prior Publication Data

US 2003/0187596 A1   Oct. 2, 2003

(30) Foreign Application Priority Data

Mar. 28, 2002   (FR) .................................. 02 03889

(51) Int. Cl.
*G06F 3/05* (2006.01)
(52) U.S. Cl. ............................ 702/64; 702/65; 702/66; 702/67
(58) Field of Classification Search ................ 702/31, 702/57, 67, 69, 116, 117, 182, 64–66; 341/143; 327/94; 712/300
See application file for complete search history.

(56) References Cited

U.S. PATENT DOCUMENTS

| | | | | |
|---|---|---|---|---|
| 5,245,343 A | * | 9/1993 | Greenwood et al. | ......... 341/143 |
| 6,255,866 B1 | * | 7/2001 | Wolaver et al. | ............. 327/107 |
| 6,664,908 B1 | * | 12/2003 | Sundquist et al. | .......... 341/143 |

FOREIGN PATENT DOCUMENTS

JP          63 103976 A        5/1988

\* cited by examiner

*Primary Examiner*—Marc S. Hoff
*Assistant Examiner*—Felix Suarez
(74) *Attorney, Agent, or Firm*—Alston & Bird LLP

(57) ABSTRACT

The invention relates to a digital circuit making it possible to measure the effective voltage of a signal, comprising at least one module exhibiting a sampler stage exhibiting an output generating an output logic signal which, for each given sampling period, exhibits a level representing the value of the voltage of the signal with respect to a given threshold (A), characterized in that it comprises a circuit (CIRC) for calculating a value representative of said effective voltage as a function of the difference between the number of times the output logic signal indicates that the voltage of the signal is above the given threshold (A) and the number of times the output logic signal indicates that this value is below said given threshold (A) over a duration corresponding to N given sampling periods.

13 Claims, 3 Drawing Sheets

DIGITAL CIRCUIT FOR MEASURING THE POWER OF A SIGNAL

Figure 1:
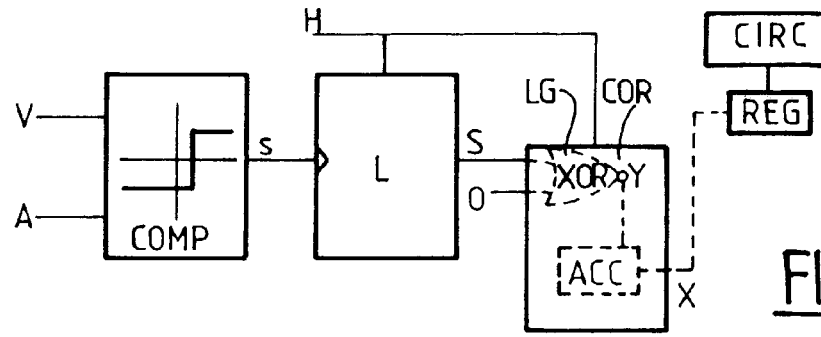

The subject of the present invention is a digital circuit making it possible to measure the effective voltage and/or the power of a signal, intended in particular for measuring the power of thermal noise.

A digital circuit which generates an output pulse each time the amplitude of the noise voltage exceeds a threshold level Vo is already known from the article by MARTTI E. TIURI entitled "Digital Measurement of Narrowband Noise Power" published in "Proceedings of the IEEE, Vol. 55 No 9—September 1967".

On the basis of the number of pulses gathered, it is possible to calculate the power of the signal with the aid of a formula which is not linear.

Moreover, the process described is applicable only to the case of noise having a low bandwidth.

At least one aforesaid drawback is avoided by virtue of a circuit according to the present invention.

The invention thus relates to a digital circuit making it possible to measure the effective voltage of a signal, comprising at least one module exhibiting a sampler stage exhibiting an output generating an output logic signal which, for each given sampling period, exhibits a level representing the value of the voltage of the signal with respect to at least one given threshold $\underline{A}$, characterized in that it comprises a circuit for calculating a value representative of said effective voltage as a function of the difference between the number of times the output logic signal indicates that said voltage of the signal is above the given threshold $\underline{A}$ and the number of times the output logic signal indicates that said voltage of the signal is below or equal to said given threshold $\underline{A}$ over an integration duration corresponding to N given sampling periods.

The calculation circuit can be characterized in that it exhibits:
- a correlator paced by a clock at said sampling period, and exhibiting a comparison logic circuit having a first input receiving said output logic signal and a second so-called comparison input to which an input logic signal (0 or 1) is applied, and an output delivering at each period of the clock signal a comparison logic signal comparing between the logic signals present at the first and second inputs of the comparison logic circuit, and an accumulation circuit for accumulating the comparison logic signal during said sampling periods N and for producing a correlation logic signal,
- and a circuit for determining a value representative of said effective voltage as a function of the difference between the number of times that the comparison logic signal is at the zero logic level and the number of times that it is at the 1 logic level over N periods of the clock signal, this determination being performed on the basis of the correlation logic signal.

The given period is advantageously that of a clock which paces the sampler stage.

According to a particular embodiment, the circuit is characterized in that a sampler stage comprises:
- a comparator having a signal input for and an input of a threshold level receiving a signal representing the given threshold and an output generating a comparison signal representing the fact that the value of the voltage of the signal is or is not above said threshold.
- a flip-flop having an input connected to the output of the comparator and an input of a clock signal having said given period and an output generating said output logic signal which represents for each period of said clock signal a value of the logic signal at the output of the comparator.

Said representative value is advantageously proportional to:

$$X' = 2|X - N/2|/N;$$

X is the number of samples at the output of the correlator which have the value Ø and N denotes the total number of samples.

The correlation logic circuit is, for example a gate of the XOR or $\overline{\text{XOR}}$ exclusive OR type, outputting the comparison logic signal.

The circuit can be characterized in that the accumulation circuit is a counting circuit accumulating the value of the comparison logic signal during N sampling periods and outputting the correlation digital signal representing the number of times that the comparison logic signal is at a given level (0 or 1), said digital signal which constitutes the output signal from the module being introduced to an input of the circuit (CIRC) for determining a representative value.

The circuit can exhibit n modules as defined hereinabove, these n modules exhibiting different thresholds $a_1, a_2, \ldots a_n$ and being arranged in parallel.

The circuit can be associated with a processing circuit which, on the basis of the n output signals for example X1, X2 ... $X_n$ available at the output of the n modules, determines an estimated frequency distribution fe, and possibly the deviation between this distribution fe and the closest Gaussian distribution fo.

Figure 2:
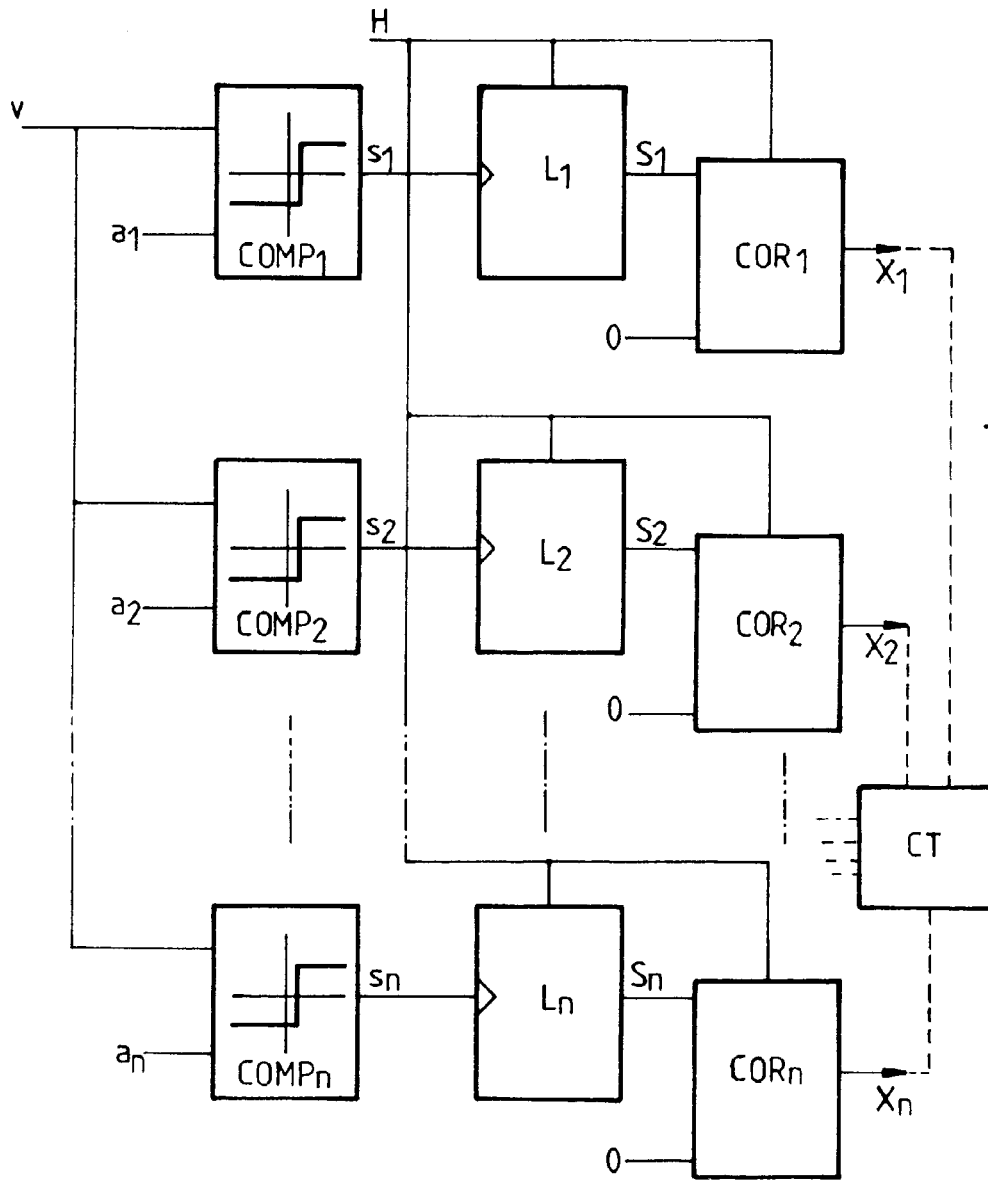
Figure 3A:
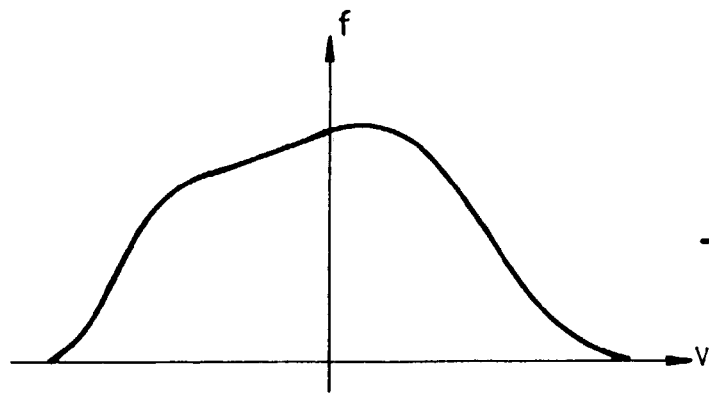
Figure 3B:
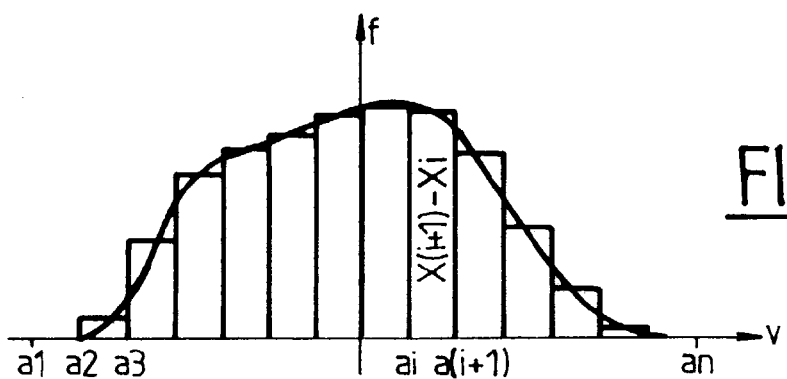
Figure 3C:
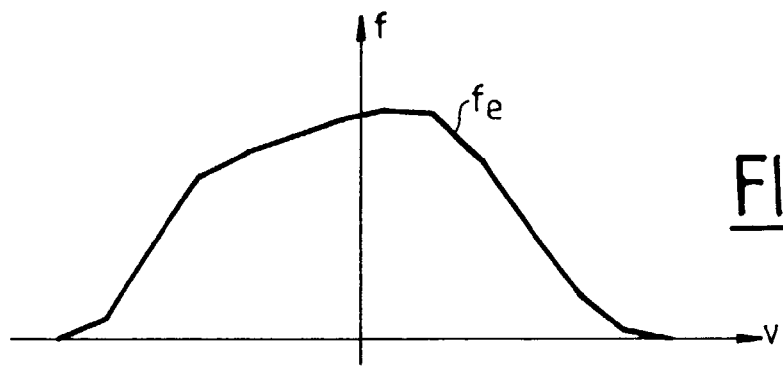
Figure 3D:
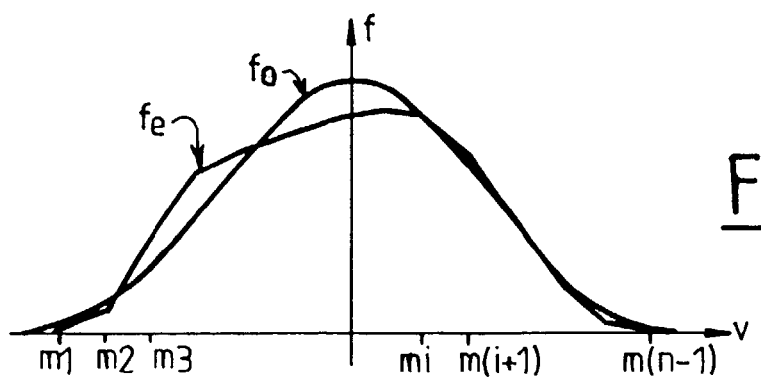
Figure 4:
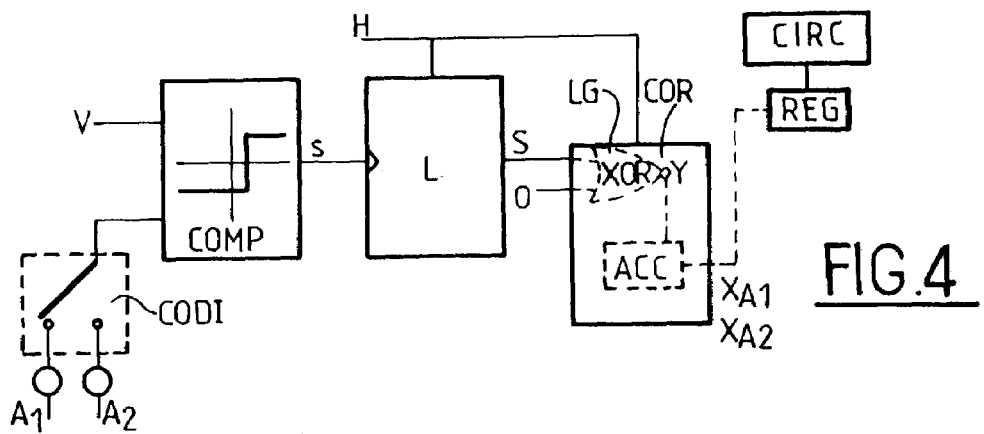
Figure 5:
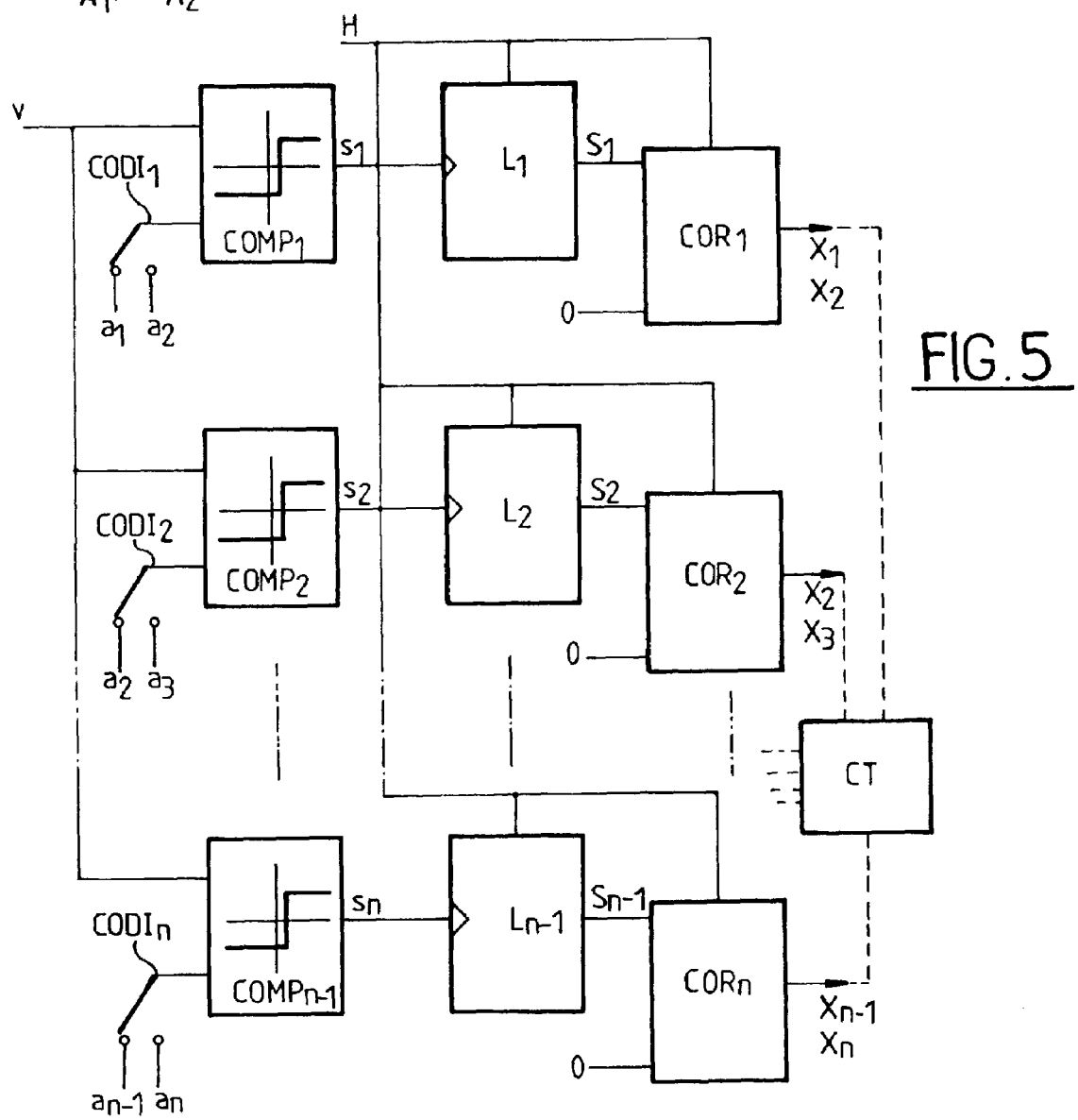

Other characteristics and advantages of the invention will become better apparent on reading the description which follows, given by way of nonlimiting example, in conjunction with the appended drawings in which:

FIG. 1 illustrates an embodiment of a detector according to the invention implementing a circuit for sampling on one bit, FIG. 2 illustrates an embodiment of a detector according to the invention implementing n circuits for sampling on one bit, FIGS. 3a to 3d illustrate an evaluation of the level of non-Gaussian noise with the aid of a circuit with n modules according to FIG. 2, and FIGS. 4 and 5 illustrate a preferred implementation of the invention.

FIG. 1 shows a module allowing the measurement of power.

It comprises in cascade a comparator COMP which functions as a 1-bit quantizer, a flip-flop L and a correlator COR.

The comparator COMP exhibits a signal input which receives the signal of voltage V and a reference input which receives a signal A representing the comparison threshold.

If the voltage V is above A, then the output signal s of the comparator COMP is a logic 1.

If the voltage V is below or equal to A, then the output signal s of the comparator COMP is a logic Ø.

The flip-flop L is a bistable which makes it possible to store the binary value of its input (the signal s generated by the comparator COMP) at each falling edge of a clock signal H. Therefore, the variations of the signal s between two falling edges of the clock H have no effect on the output S of the flip-flop L.

The correlator COR is a logic circuit with two inputs and one output. It comprises an accumulator ACC and possibly a logic gate LG cascaded with the accumulator ACC. The logic gate LG is in particular an exclusive OR gate (XOR) or an inverted exclusive OR gate ($\overline{XOR}$).

The logic gate LG paced by the clock H receives the signal S at an input $E_1$ and a logic signal which is constant over time, and which may be a 0 or a 1, at its other input $E_2$. The gate LG outputs a logic signal Y.

In the case of an ($\overline{XOR}$) gate, the truth table is as follows:

|  |  | $E_1$ | $E_2$ | Y |
|---|---|---|---|---|
| Case 1 | $E_2 = 0$ |  |  |  |
|  |  | 0 | 0 | 1 |
|  |  | 1 | 0 | 0 |
| Case 2 | $E_2 = 1$ |  |  |  |
|  |  | 0 | 1 | 0 |
|  |  | 1 | 1 | 1 |

The accumulator ACC is a counter paced by the clock H which serves to count the number of times the signal S is at a given level. For example, at each period of the clock H, the count of the accumulator ACC is incremented by 1 if the output S of the flip-flop L is at the 1 level, and remains at the same level if the output S is at the 0 level. After a certain integration time (corresponding to N periods of the clock H), the content X of the accumulator ACC (the so-called correlation signal) is transferred to a register REG and the accumulator ACC is reset to zero, to perform another integration cycle of the same duration or of a different duration. Alternatively, the accumulator ACC is situated outside the module and forms for example part of the calculation circuit CIRC. In this case the correlator is in two parts, one in the input module which, on the basis of the signal V, generates the signal S or Y, and one in the calculation module including the circuit CIRC. The signal Y (or the signal S) then constitutes the output from the module, and the accumulation of results is carried out outside the module or modules, for example in the circuit CIRC.

In this embodiment, the result of the correlation (output X) represents the number X of 0s or of 1s present at the output of the flip-flop L during the integration time (N periods of the clock H).

Let X be the number of 0s and N the number of samples during the integration time.

We calculate a number X':

$$X' = 2(X - N/2)/N$$

X' is inversely proportional to the effective value $\sigma_v$ ("rms") of the voltage v:

$$X' = \sqrt{2/\pi} A/\sigma_v$$

The mean power can be obtained by squaring the effective voltage $\sigma_v$.

A single module such as described hereinabove can be used in applications such as the determination of the power of a signal, or for the detection of interference in a radiometry system, in particular an interferential radiometry system, or to allow correction of interference.

Of course, the above result can be obtained through other counting processes, the above process illustrating a preferred embodiment.

The detection of an effective voltage ("arms") can be achieved (see FIG. 2) by using in parallel n modules according to FIG. 1, paced by the same clock with n comparison thresholds $a_1, a_2, \ldots a_n$ for the comparators $COMP_1, COMP_2, \ldots COMP_n$ cascaded with the flip-flops $L_1, L_2, \ldots L_n$ which deliver signals $S_1, S_2, \ldots S_n$. n signals $X_1, X_2, \ldots X_n$ are obtained at the output of the correlators $COR_1, COR_2, \ldots COR_n$ from the signals $S_1, S_2, \ldots S_n$.

For the detection of interference in a radiometric system, it is preferable to use n modules in parallel according to FIG. 2.

The radiometric systems receive radiations emitted by thermal sources for which the amplitude distribution is Gaussian. If the noise signal received is contaminated with unwanted interference, the distribution of the signal is no longer Gaussian. Under the customary conditions, the contamination of the signal can be determined only after post-processing of the signal.

The implementation of several modules in parallel with different thresholds which correspond to the distribution without contamination, makes it possible to measure the shape of the distribution in real time and hence to detect the interferential contamination while avoiding post-processing of the contaminated data.

The estimation of the distribution of the signal is obtained with the aid of a processing circuit CT which uses the numbers $X_1, X_2, \ldots X_n$ obtained at the output of each of the modules, each of which has a different reference level $a_1, a_2, \ldots a_n$.

It is of course possible to accumulate the results (signals $X_1, X_2, \ldots X_n$) in the circuit CT.

On the basis of each of the numbers $X_1, X_2, \ldots X_i \ldots X_n$ we calculate the numbers $X'_1, X'_2, \ldots X'_i \ldots X'_n$ with:

$$X'_i = 2(X_i - N/2)/N$$

When $a_{i+1} > a_i$ for i-1, 2-n, then we have $X'_{i+1} < X'_i X'_i$ denoting the number of correlations obtained during an integration time covering N periods of the clock H.

On the basis of the differences $X'_i - X'_{i+1}$ we obtain the number of samples of input voltage V which lie between the thresholds $a_i$ and $a_{i+1}$.

The estimated value $f_e$ of the distribution density of the voltage v is obtained for example by calculating the differences as a function of the midpoint $m_i = (a_i + a_{i+i})/2$ [sic]. FIG. 3a shows the distribution density of the signal v, FIG. 3b shows the staircasing of the thresholds, and FIG. 3c shows the estimate $f_e$ of the distribution density of the signal V.

The degree of contamination of the Gaussian noise by interference can be determined by calculating the error between the estimated distribution $f_e$ and the closest Gaussian distribution fo determined by the method of least squares (see FIG. 3d).

The error E has been calculated as follows:

$$E = \sqrt{\sum_{i=1}^{n-1} [f_e(m_i) - f_0 m_i)]^2}$$

this corresponding to the square root of the area lying between the two curves of FIG. 3d.

For E a purely Gaussian signal, E is equal to zero, or very nearly zero. E increases with the degree of contamination. One can then decide to reject a signal if E exceeds a given threshold.

The power of the signal is given by the following formula:

$$P = V_{rms}^2 = \sum_{i=1}^{n-1} (X'_i - X'_{i+1}) m_i^2$$

There are conditions on the values of the thresholds which must be satisfied if one wishes to obtain high accuracy.

For a detector of effective value $\sigma_v$ ("rms") of a voltage, operating with quantization on one bit, it is necessary for the threshold A to be much lower than the effective voltage $\sigma_v$ and in practice:

$$A \leq \frac{\sigma_v}{10}$$

The relative error $\Delta X'/X'$ can be determined with the aid of the formula:

$$\frac{\Delta X'}{X'} = -\frac{1}{6}\left(\frac{A}{\sigma_v}\right)^2$$

For $A/\sigma_v=10$, we have $\Delta X'/X'=-1.7 \; 10^{-3}$.

Furthermore, the higher the number of samples N, the smaller the error in the relative power. The best applications of the device according to the invention are those where the integration time is not critical, that is to say, in particular those where the offsets such as the thermal offsets of the threshold voltage or voltages $a_i$ are not significant.

As compared with a known quadratic detector, having an integration time T, with a device according to the invention, an integration time $T_D$ is in fact required in order to obtain the same accuracy. We have:

$$T_D = \pi T (\sigma_v/A)^2.$$

A device according to the invention exhibits low sensitivity to temperature, high linearity over a wide dynamic range.

It is practically devoid of offset.

In general, it exhibits lower sensitivity than a quadratic detector, but this drawback is compensated for if the integration time is increased.

The invention requires fast circuits which can operate at a frequency equal to at least 2.2 B, for a signal V of bandwidth B (to comply with the sampling theorem).

The correlator must be capable of processing a number of samples of the order of $10^8$, this posing no problem with a 4-byte (32-bit) counter.

FIG. 4 illustrates a preferred embodiment of the invention according to which it is possible to compensate for the offset at the input of the comparator, in practice a commercial integrated circuit (differential amplifier, also known as an operational amplifier). In such circuits, even ones which are thermostatically controlled or temperature compensated, an offset voltage td which tends to increase slowly with time appears at the input. Since this is a slow phenomenon, it is possible to eliminate it to a large extent by performing the comparison not with reference to a single threshold A as in the previous embodiments, but by using two threshold voltages, A1 and A2, as indicated in FIG. 4 with a switch CODI making it possible to apply the threshold A1 or the threshold A2 to the comparator COMP. These threshold voltages A1 and A2 can be generated using thermostatically controlled and/or temperature compensated generators, which are themselves stable over time.

In the course of an integration period, we obtain $X_{A1}$ zeros with respect to the threshold A1, and $X_{A2}$ zeros with respect to the threshold A2.

This integration can be carried out for the threshold A1 and then for the threshold A2, but this integration is preferably carried out alternately (a sample for the threshold A1, a sample for the threshold A2, then a new sample for the threshold A1 and so on and so forth).

By virtue of the offset voltage td at the input of the comparator COMP, the comparison is not performed with respect to the threshold A1 and to the threshold A2, but to the threshold A1+td and to the threshold A2+td.

We have:

$$X'_{A1}=2(X_{A1}-N1/2)/N1$$

$$X'_{A2}=2(X_{A2}-N2/2)/N2.$$

N.B.: In practice, we choose: N1=N2=N

We have:

$$X'_{A1} = \sqrt{2/\pi} \frac{A_1 + t_d}{\sigma_v}$$

$$X'_{A2} = \sqrt{2/\pi} \frac{A_2 + t_d}{\sigma_v}$$

and from this it follows that:

$$X'_{A1} - X'_{A2} = \sqrt{2/\pi} \frac{A_1 - A_2}{\sigma_v} = 2(X_{A1} - X_{A2})/N$$

thereby making it possible to determine $\sigma_v$ by eliminating the offset td.

Optimal elimination of the offset td is obtained by using, as switch CODI, a Dicke switch.

Such a switch is for example described in the work by Fawwaz T. ULABY and collaborators entitled "Microwave Remote Sensing" Vol. 1 "Microwave Remote Sensing—Fundamentals and Radiometry" pages 369 to 374 ("6–9 Dicke Radiometer").

The Dicke switch CODI periodically switches the threshold input between the values $A_1$ and $A_2$. The output S of the flip-flop L is counted synchronously with the switching of the Dicke switch, for each of the thresholds $A_1$ and $A_2$, in such a way as to store in the accumulator ACC, on the one hand the count $X_{A1}$ and on the other hand the count $X_{A2}$.

It is then possible to calculate the difference $X_{A1}-X_{A2}$ and hence $\sigma_v$.

The same principle can be applied to the embodiment of FIG. 2, by associating not one but two thresholds with each comparator $COMP_1$, $COMP_2$. . . $COMP_n$, namely the thresholds $a_1$ and $a_2$ for the comparator $COMP_1$, $a_2$ and $a_3$ for the comparator $COMP_2$ and so on and so forth, with the thresholds $a_{n-1}$ and $a_n$ for the comparator $COMP_{n-1}$.

The switching between the thresholds is effected by switches $CODI_1$, $CODI_2$. . . $CODI_{n-1}$, for example Dicke switches.

The correlator $COR_1$ thus delivers signals $X_1$ and $X_2$ associated respectively with the thresholds $a_1$ and $a_2$ applied to the comparator $COMP_1$ to calculate $X'1-X'2$, with compensation for the offset at the input of $COMP_1$.

The correlator $COR_2$ delivers the signals $X_2$ and $X_3$ associated respectively with the thresholds $a_2$ and $a_3$ applied to the comparator $COMP_2$ to calculate $X'_2-X'_3$, with compensation for the offset at the input of $COMP_2$, and so on and so forth up to the correlator $COR_{n-1}$ via the correlator $COR_i$ which delivers the signals $X_i$ and $X_{i+1}$ associated respectively with the thresholds $a_i$ and $a_{i+1}$ applied to the comparator $COMP_i$ to calculate $X'_i - X'_{i+1}$ with compensation for the offset at the input of $COMP_i$.

Thus, each of the differences obtained is compensated for the input offset of the associated comparator. The power P is calculated from differences, each of which is compensated for offset.

As in the case of FIGS. 1 and 2, there is a condition such that the results obtained have good accuracy.

We shall choose:

$$A_1 - A_2 \approx \frac{\sigma \min}{10}$$

σ min denoting the minimum value of $\sigma_v$.

The invention claimed is:

1. A digital circuit making it possible to measure the effective voltage of an input signal, comprising at least one module including a sampler stage having an output generating an output logic signal which, for each given sampling period, exhibits a level representing the value of the voltage of the signal with respect to at least one given threshold (A), characterized in that it comprises a circuit (CIRC) for calculating a value representative of said effective voltage as a function of the difference between the number of times the output logic signal (S) indicates that the voltage of the input signal is above the given threshold (A) and the number of times the output logic signal (S) indicates that this voltage is below said given threshold (A) over a duration corresponding to N given sampling periods.

2. The circuit according to claim 1, characterized in that it includes a switching circuit ($COD_i$) making it possible to apply a first ($A_1$) and a second ($A_2$) different given threshold to the digital circuit and in that it comprises a so-called circuit (CIRC) for calculating said effective voltage as a function, on the one hand of the difference between the number of times the output logic signal (S) indicates that the voltage of the input signal is above the first given threshold ($A_1$) and the number of times the output logic signal (S) indicates that this voltage is below said first given threshold ($A_1$) and on the other band as a function of the difference between the number of times the output logic signal (S) indicates that the voltage of the input signal is above the second given threshold ($A_2$) and the number of times the output logic signal (S) indicates that this voltage is below said second given threshold ($A_2$).

3. A circuit according to claim 1, characterized in that the calculating circuit includes:
   a correlator (COR) paced by a clock (H) at said sampling period, and having a comparison logic circuit having a first input receiving said output logic signal (S) and a second so-called comparison input to which an input logic signal (0 or 1) is applied, and an output delivering at each period of the clock signal a comparison logic signal (Y) comparing between the logic signals present at the first and second inputs of the comparison logic circuit, and an accumulation circuit (ACC) for accumulating the comparison logic signal (Y) during the N sampling periods and for producing a correlation logic signal (X),
   and a circuit (CIRC) for determining a value representative of said effective voltage as a function of the difference (X') between the number of times that for each so-called given threshold the comparison logic signal (Y) is at the zero logic level and the number of times that this output is at the 1 logic level over N periods of the clock signal (H), this determination being performed on the basis of the correlation logic signal (X).

4. The circuit according to claim 1, characterized in that said given period is the period of a clock (H) which paces the sampler stage.

5. The circuit according to claim 4, characterized in that the sampler stage comprises:
   a comparator (COMP) having a signal input for receiving the input signal and an input of a threshold level receiving a signal (A) representing the given threshold and an output generating a comparison signal (s) representing the fact that the value of the voltage of the input signal is or is not above said threshold (A),
   a flip-flop (L) having an input connected to the output of the comparator (COMP) and an input of a clock signal (H) having said given period and an output generating said output logic signal (S) which represents for each period of said clock signal a value of the logic signal (s) at the output of the comparator (COMP).

6. The circuit according to claim 3, characterized in that the correlator (COR) comprises an exclusive OR gate (XOR) outputting said correlation logic signal (Y).

7. The circuit according to claim 6, characterized in that said gate is an inverted exclusive OR gate (XOR).

8. The circuit according to claim 3, characterized in that a so-called representative value is proportional to:

$$X' = 2|X - N/2|/N$$

X being the number of samples at the output of the correlator having the value 0 for a so-called given threshold, and N denoting the total number of samples.

9. The circuit according to claim 3, characterized in that the accumulation circuit is a counting circuit (ACC) accumulating the value of the comparison logic signal (Y) during N sampling periods and outputting said correlation digital signal (X) representing the number of times that the comparison logic signal is at a given level (0 or 1), said digital signal (X) which constitutes the output signal from the correlator (COR) being introduced to an input of the circuit (CIRC) for determining a representative value.

10. A digital circuit characterized in that it includes n modules according to claim 1, each of these n modules exhibiting one of the n different thresholds ($a_1, a_2, \ldots a_n$) and being arranged in parallel.

11. A digital circuit characterized in tat it includes n−1 modules according to claim 1, each of these n modules exhibiting two different thresholds, a first module exhibiting a first ($a_1$) and a second ($a_2$) threshold, a second module exhibiting the second ($a_2$) and a third ($a_3$) threshold, and so on and so forth up to the $(n-1)^{th}$ module which exhibits an $(n-1)^{th}$ threshold ($a_{-1}$) and an $n^{th}$ threshold ($a_n$).

12. The circuit according to claim 10, characterized in that it is associated with a processing circuit which, on the basis of the n output signals ($X_1, X_2, \ldots X_n$) from the n modules, determines an estimated frequency distribution $f_e$ of the voltage of the signal V.

13. The circuit according to claim 12, characterized in that the processing circuit also includes a calculation module for calculating the error between said estimated distribution $f_e$ and the closest Gaussian distribution $f_o$.

* * * * *

UNITED STATES PATENT AND TRADEMARK OFFICE
CERTIFICATE OF CORRECTION

| | | |
|---|---|---|
| PATENT NO. | : 7,010,439 B2 | Page 1 of 1 |
| APPLICATION NO. | : 10/391869 | |
| DATED | : March 7, 2006 | |
| INVENTOR(S) | : Martin Neira et al. | |

It is certified that error appears in the above-identified patent and that said Letters Patent is hereby corrected as shown below:

Column 7,
Line 42, "band" should read --hand--.

Column 8,
Line 48, "tat" should read --that--.

Signed and Sealed this

Eighth Day of August, 2006

JON W. DUDAS
*Director of the United States Patent and Trademark Office*